United States Patent [19]

von Roesgen

[11] 4,129,349

[45] Dec. 12, 1978

[54] QUICK-CONNECT BREADBOARDING SYSTEM

[75] Inventor: Charles A. von Roesgen, Westfield, N.J.

[73] Assignee: Bell Telephone Laboratories, Incorporated, Murray Hill, N.J.

[21] Appl. No.: 630,183

[22] Filed: Nov. 10, 1975

[51] Int. Cl.² ............................................. H01R 9/08
[52] U.S. Cl. .............................. 339/17 C; 339/99 R; 339/217 S; 361/413
[58] Field of Search ............... 29/203 B; 339/17 C, 339/17 CF, 97 R, 97 P, 98, 99 R, 95 D, 217 S; 317/101 CC; 174/117 PC; 361/413

[56] References Cited

U.S. PATENT DOCUMENTS

| | | | |
|---|---|---|---|
| 3,027,536 | 3/1962 | Pasternak | 339/97 R |
| 3,621,445 | 11/1971 | Horecky et al. | 339/17 C |
| 3,917,984 | 11/1975 | Kong et al. | 317/101 CC |
| 3,976,350 | 8/1976 | Keglewitsch | 339/97 P |

Primary Examiner—Z. R. Bilinsky
Attorney, Agent, or Firm—Charles E. Graves

[57] ABSTRACT

The breadboarding of complex electrical circuits is simplified by performing all interconnections on one side of a component-receiving board, using slotted beam insulation-piercing connectors. Boards with or without metallization patterns are adaptable to the basic approach. Using boards with an X-Y pattern of plated-through holes arranged in columns, slotted beam connector elements are readily pressed into one side; and corresponding circuit elements such as dual-in-line packs plugged from the other side into the connector elements. The system is enhanced by a tool which feeds insulated conductor from a source and into selected slotted beams. The tool includes a retraceable knife with which a given wire run may be terminated. For the manual mode, a sequence of wiring is indicated to an operator by stepping of a laser beam which illuminates successive slotted beams to be connected.

5 Claims, 22 Drawing Figures

QUICK-CONNECT BREADBOARDING SYSTEM

BACKGROUND OF THE INVENTION

1. Field of the Invention

This invention relates to circuit assembly techniques; and more specifically to breadboard apparatus.

2. Description of the Prior Art

Breadboards, i.e., hand-wired circuit assemblies, are used in all phases of circuit development, exploratory as well as final, to test on a short turn-around basis the operation of a circuit or a system design. Characteristics to be desired in breadboard systems include: a simple and versatile way to mount components; an efficient way to make interconnections; an easy way to make wiring changes; and sufficient interconnection reliability so that breadboards can be used in early field-trial work.

In digital circuit design, perforated wirewrap board and wirewrap terminals have been used extensively for breadboarding. This breadboarding system accepts dual-in-line packages (DIPs) on the component side and has wirewrap terminals on the wiring side. Although this method of breadboarding is widely used, it has major drawbacks. Wiring is slow: the conductor must be cut, stripped, and wrapped. Terminal identification is prone to error. Changes are difficult in make: it requires unwrapping one, two, or sometimes three wires depending on how many wires are on the pin and which wire must be changed. Overall board thickness (DIP plus board plus pin length) often precludes use in standard shelves.

Thus, objects of the present invention are:
to avoid stripping and cutting of wire during breadboarding;
to require just one wire for each set of common connections;
to simplify wiring corrections;
to reduce the height or width of a breadboard installation; and
to make use of semiautomatic wiring machine techniques to reduce or eliminate the possibility of operator error in terminal identification.

SUMMARY OF THE INVENTION

The invention resides in a breadboarding technique utilizing quick-connect insulation-piercing slotted-beam connectors mounted on a wiring board having an X-Y pattern of through-holes, preferably including metallization around and through each. Components are mounted to one side of the wiring board, and their terminals are connected by wiring together the designated corresponding slotted beam connectors. Wiring is facilitated by a tool which feeds and forces unstripped conductor into the slotted beam connector terminal. A terminal-connecting conductor is "daisy-chained" through each designated terminal and is cut only at the end of a wire run.

In one embodiment, the X-Y pattern of holes takes the form of holes arranged in plural parallel columns, with discrete metal lands on the board's top and bottom surfaces each surrounding a respective hole. Slotted beam connector elements are pressed into the metallized holes from one side of the board, and then component terminals are plugged from the other side of said board into the connector elements.

The slotted beam elements may be mounted in the module in the configuration of a DIP, for convenience. Additionally, or alternatively, the slotted beam elements may be mounted individually. Several advantageous hardware variants on the basic theme for providing slotted beam connectors are disclosed.

The invention, its further features, objects and advantages are more fully described in the following detailed description of the illustrative embodiment.

DESCRIPTION OF THE ILLUSTRATIVE EMBODIMENT

Figure 1:
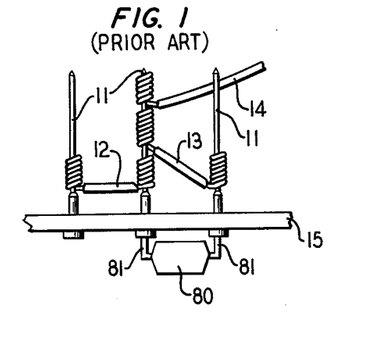
FIG. 1 is a side view of the prior art wirewrap system using wirewrap terminals with component sockets.

FIG. 1 succinctly illustrates the prior art breadboarding technique using wirewrap terminals 11 mounted in a board 15. The wirewrap connections 12, 13, 14 quickly build up width; and are relatively difficult to rearrange as illustrated, for example, by the predicament of interior connection 12.

Figure 2:
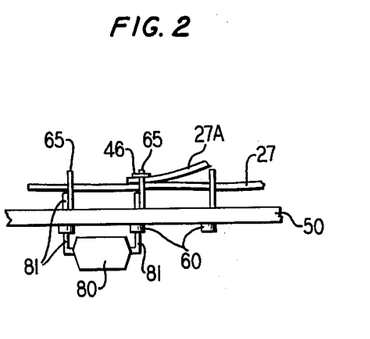
FIG. 2 is a side view of the new quick-connect system using insulation-piercing slotted-beam connector terminals with component sockets.
Figure 3A:
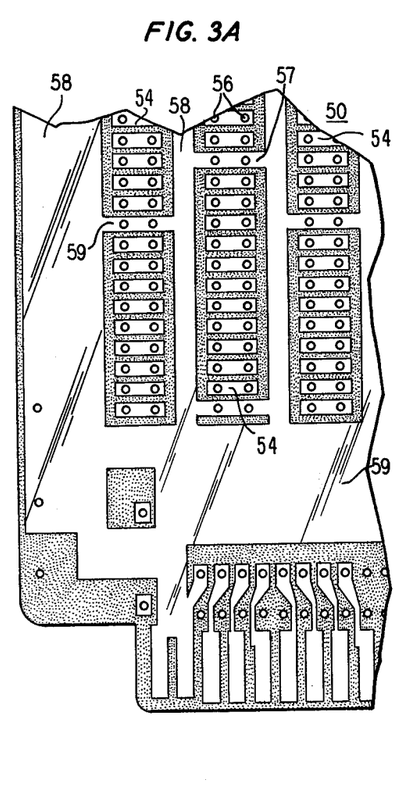
FIG. 3A is a top view of a printed circuit board used in this invention showing a hole and metallization pattern.
Figure 3B:
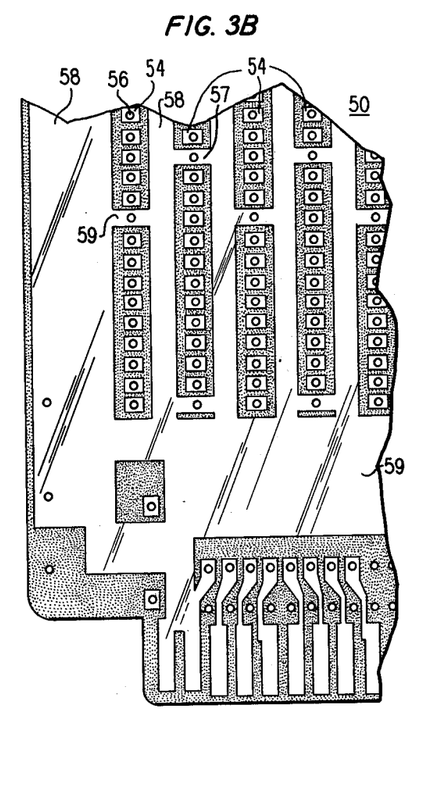
FIG. 3B is a top view of a printed circuit board used in this invention showing a hole and metallization pattern used in conjunction with connection element shown in FIG. 5.

The invention disclosed herein includes a breadboarding apparatus for mounting an electrical circuit comprising circuit elements 80 with pin terminals 81, shown in FIG. 2. The printed circuit board 50 utilizes hole pattern and metallization patterns shown in FIG. 3A and 3B. The metallization pattern consists of columns of metal lands 54 located on both the component side 51 and the wiring side 52 of printed circuit board 50. Each metal land 54 and its corresonding metal land on the opposite side surrounds either one or a pair of cylindrical metallized holes 56 which electrically connect corresponding metal lands. A separate metal grid 57 on each side of printed circuit board 50 surrounds columns of lands 54. Grid 57 includes vertical metallized paths 58 connected by horizontal metal paths 59. These metallized grids 57 provide on the component side 51, a power bus; the wiring side 52, a ground bus.

Figure 4:
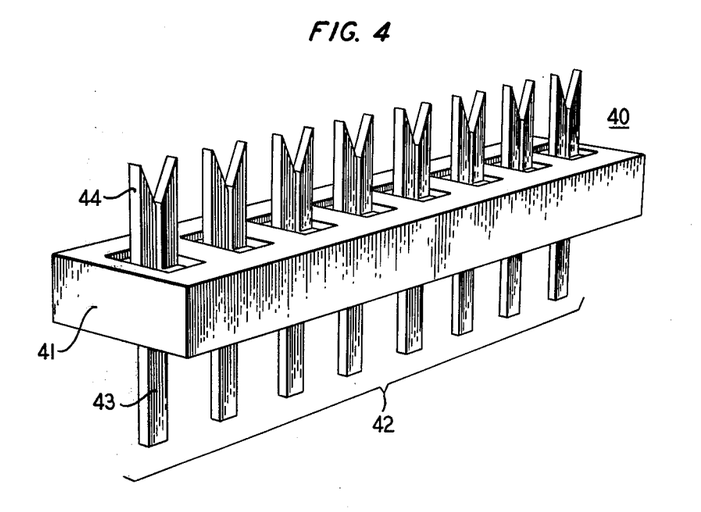
FIG. 4 is a perspective view of a connector module.

Connector module 40, shown in FIG. 4, is comprised of an elongated body 41 and electrically conductive metal elements 42 imbedded therein. These metal elements 42 have a shaft end 43 and an insulation-piercing slotted-beam connector terminal 44 (hereafter referred to as IPSBC terminal) on the opposite end. Connector module 40 can be made in long strips that can be cut to any required length.

Figure 5:
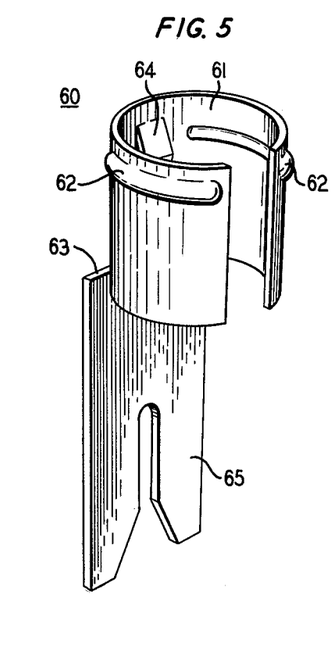
FIG. 5 is a perspective view of a connection element.

The IPSBC may take the form shown in FIG. 5. The IPSBC element 60 uses an elongated semicylindrical finger to form socket 61 for accepting a component pin terminal 81. Elongated protrusions 62 are provided as a means of mounting in a printed circuit board. Within socket 61 is a contact spring 64 to grip and electrically contact a component pin terminal 81. The socket 61 is connected to an IPSBC terminal 65 at shoulder 63 which is formed as a stop to prevent element 60 from being pushed through printed circuit board 50.

Figure 6:
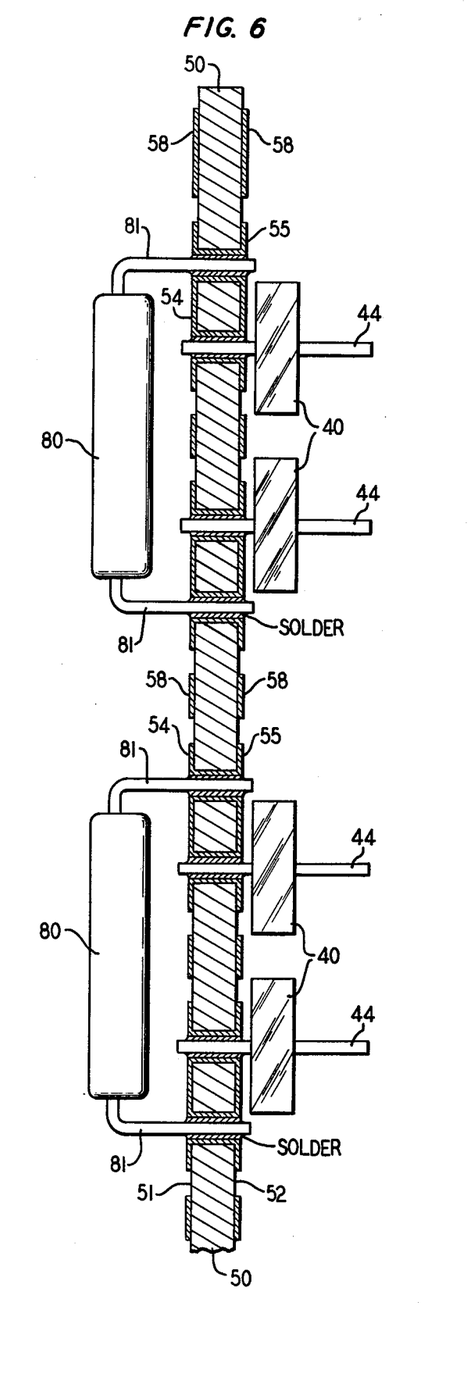
FIG. 6 is a side view in partial cross section showing a portion of the printed circuit board with components and wiring terminals mounted.

Connector modules 40 and/or connection elements 60 are mounted to the wiring side 52 of board 50. Components 80 are mounted to the component side 51 of board 50 either by soldering as in FIG. 6, or pushing component pins 81 into sockets 61 of connection elements 60.

Figure 7:
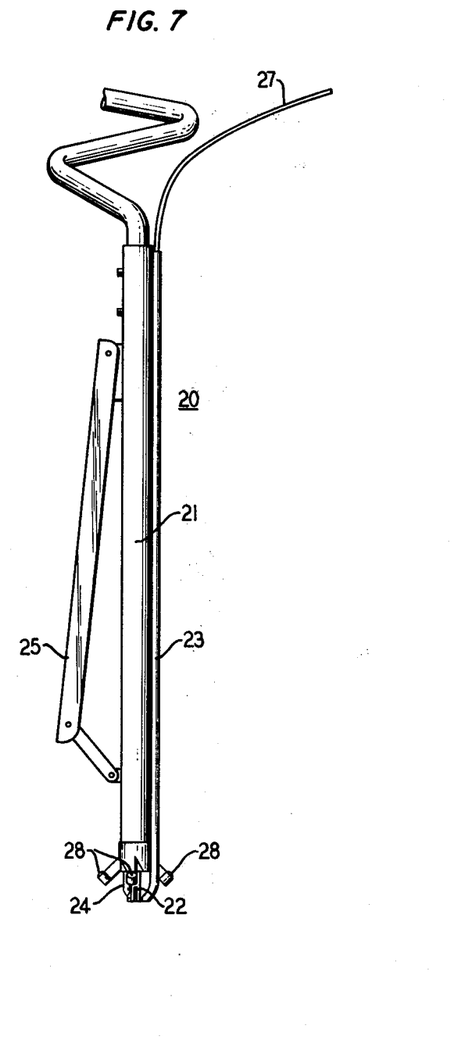
FIG. 7 is a side view of the tool used in this breading technique.

Pursuant to this invention a tool 20 shown in FIG. 7 aids in hand wiring. The tool 20 is comprised of a body 21, a stuffer 22 rigidly affixed thereto, and a conductor feed tube 23. A knife 24 and an activating mechanism 25 is provided to terminate a wire run. Photo transistors 28 may be attached to body 21 for reasons stated later.

Figure 8A:
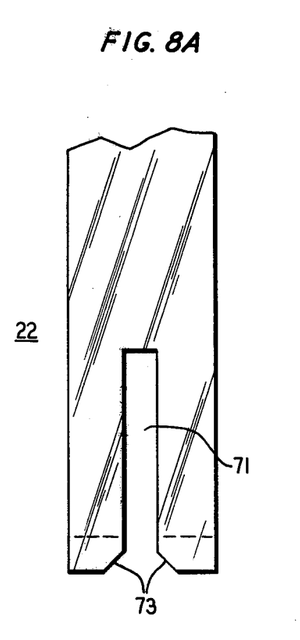
FIG. 8A is a side view of the stuffer portion of said tool.
Figure 8B:
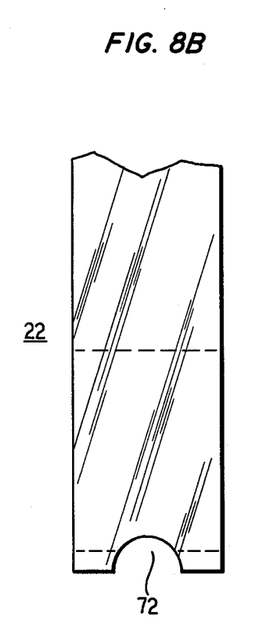
FIG. 8B is a front view of the stuffer portion of said tool.
Figure 8C:
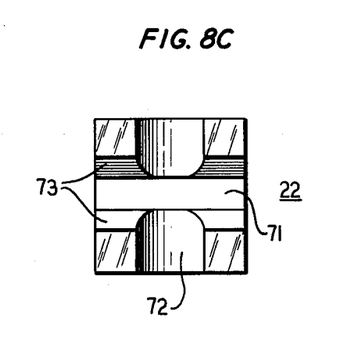
FIG. 8C is a bottom view of the stuffer portion of said tool.

The stuffer 22 is shown in more detail in FIGS. 8A, 8B and 8C. A slot 71 therein provides clearance while the chamfer 73 helps guide the stuffer 22 over the IPSBC terminal and while mouth 72 embraces conductor 27.

Figure 9:
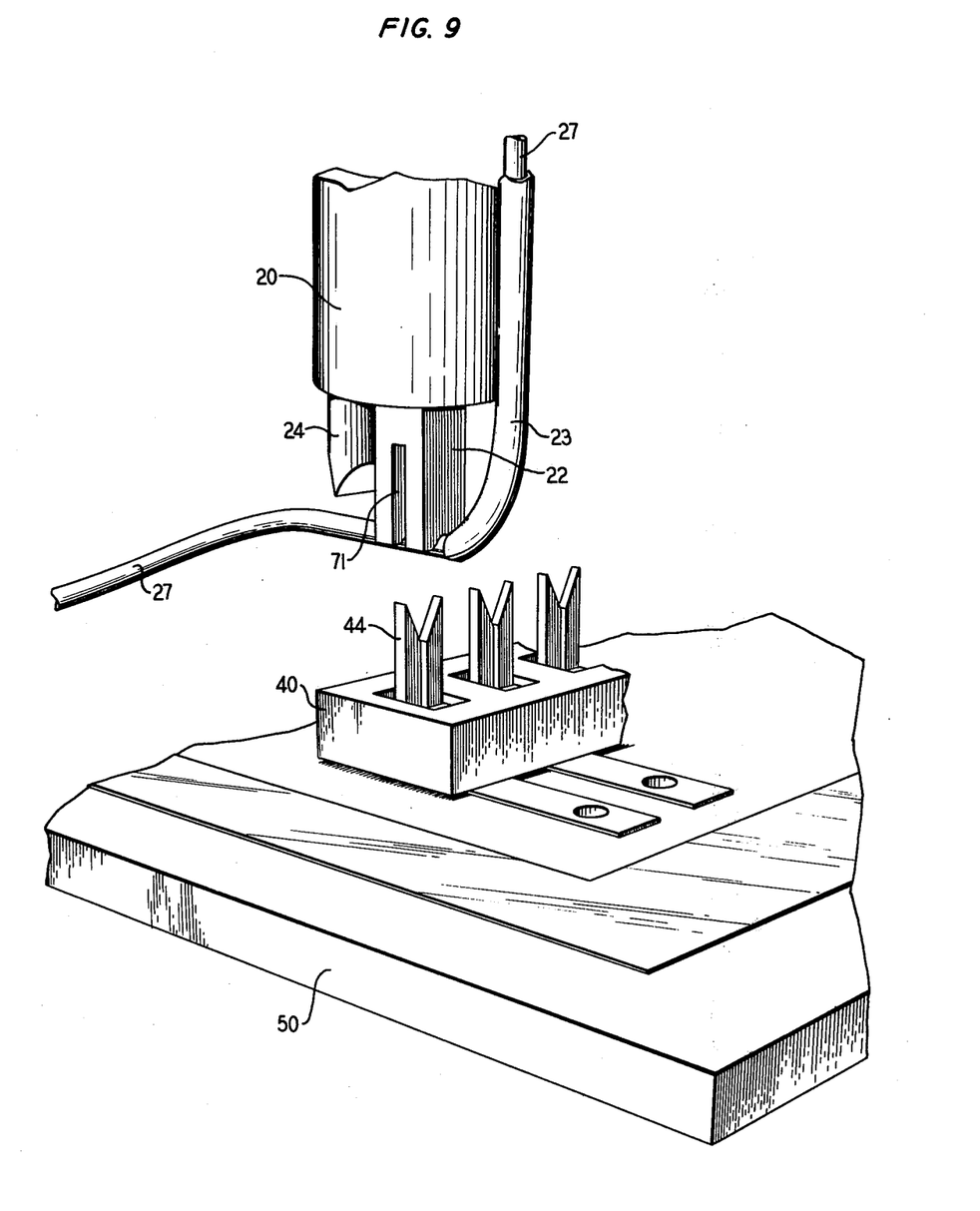
FIG. 9 is a perspective view of a section of printed circuit board with a portion of a connector module mounted thereon, and the lower part of said tool.

A connection is made by pushing an insulated electrical conductor 27, typically 30 gauge, into an appropriate IPSBC terminal with tool 20. FIG. 9 shows tool 20 poised above an IPSBC terminal 44 ready for making a connection.

Figure 10A:
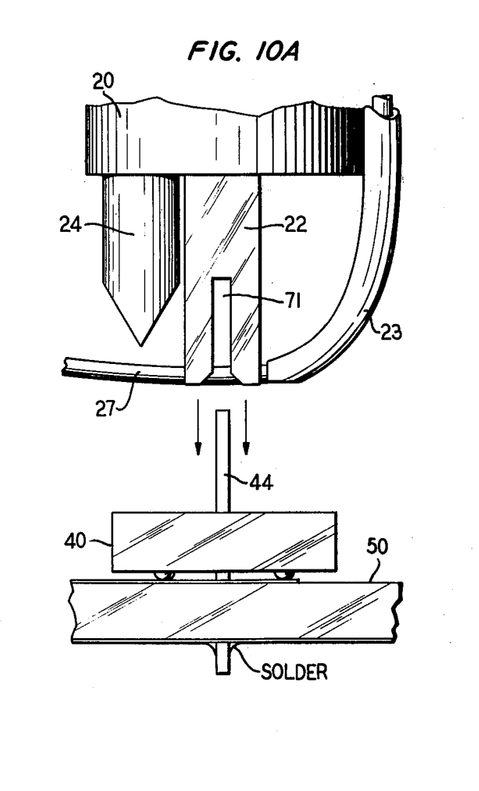
FIG. 10A is a side view of a section of printed circuit board with a portion of a connector module mounted thereon, and the lower part of said tool just prior to making an electrical connection.
Figures 10B, 10C:
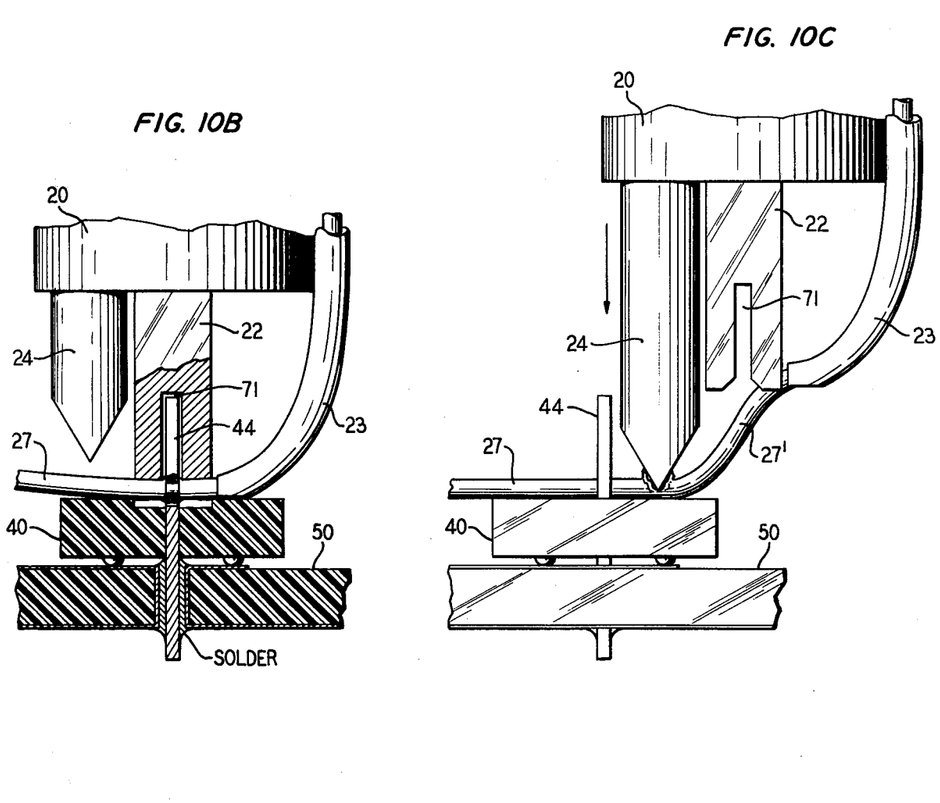
FIG. 10B is a side view in partial section of the same equipment shown in FIG. 10A at the moment the electrical connection is being made.
FIG. 10C is a side view of the same equipment shown in FIG. 10A after the electrical connection has been made and at the moment the conductor is being severed. The knife has been protracted and moved to the appropriate location.

FIG. 10A and FIG. 10B are a sequence showing tool 20 being lowered to the IPSBC terminal 44 and the connection being made. Tool 20 may then be lifted and moved to the next terminal while the conductor feed tube 23 feeds out the required length of conductor 27.

If that is the last terminal of a wire run, tool 20 may be lifted and moved to the appropriate side of the IPSBC terminal 44 where the activating mechanism 25 is engaged, the knife 24 is extended and the conductor 27 is severed between the blade and the board. A virtue of the design of tool 20 is that after the cut is made, a sufficient length of conductor 27' is left protruding from conductor feed tube 23 to make a new connection.

Frequently a board must undergo changes after it has been wired. When the technique described above is used, adding new connections or removing others is straightforward. However, extending an existing connection to include additional points presents a problem since the IPSBC terminal makes a reliable connection to only one wire. Obviously, the web of wire in question could be removed and rewired to include the additional points, but this process can be complicated and time consuming.

Figure 11A:
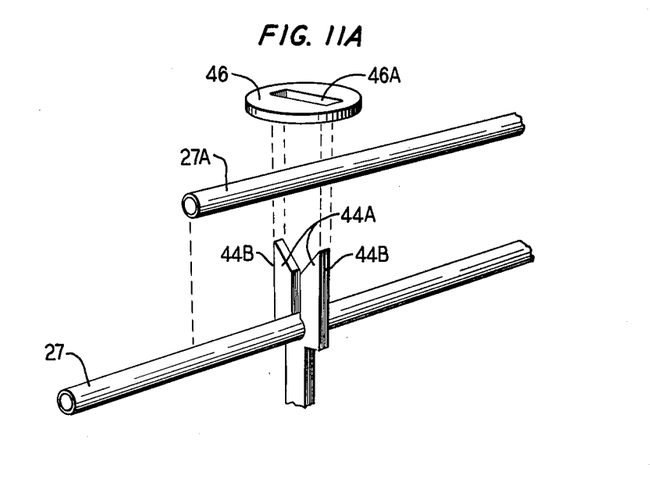
FIG. 11A is a perspective view showing a two-wire to one-terminal connection prior to being made.
Figure 11B:
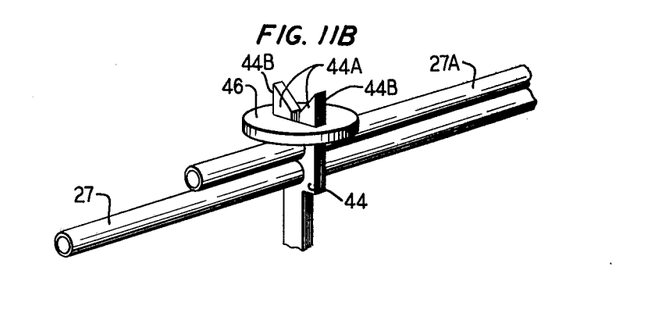
FIG. 11B is a perspective view showing a two-wire to one-terminal connection after the connection has been made.

This problem is solved by a washer 46 with a slot 46A of the appropriate length and width, as seen in FIG. 11A. The second conductor 27A may be pushed into the IPSBC terminal 44 directly on top of the first conductor 27. The IPSBC 44 has bifurcations 44A, with tapered outside walls 44B. When the slot 46A of washer 46 is pushed over bifurcations 44A, FIG. 11B, they are squeezed together to effect a reliable two-wire connection.

Figure 12A:
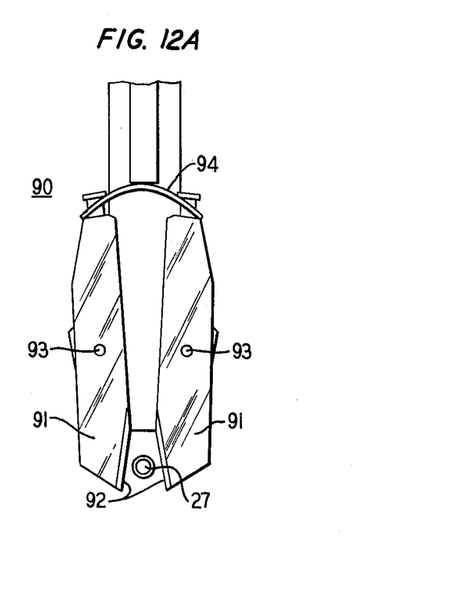
FIG. 12A shows a front view of an alternate wire cutter prior to cutting the conductor.
Figure 12B:
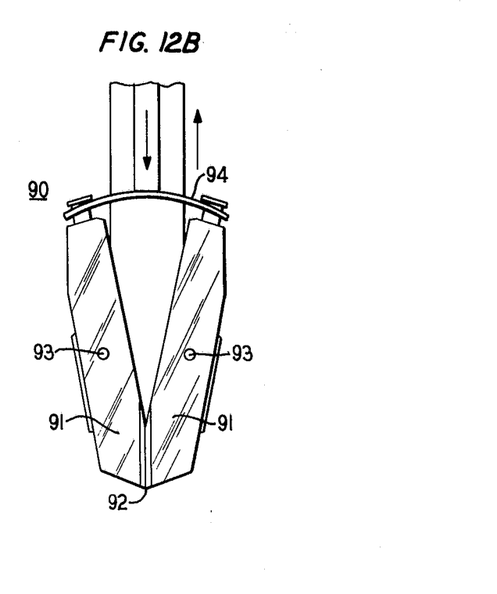
FIG. 12B shows said alternate wire cutter at the moment the conductor is severed.

The knife 24 described above requires a backing such as the body of connector module 40 below the conductor 27 in order to sever said conductor, FIG. 10C. An alternate wire cutter 90 which does not require such a backing is shown in FIG. 12A and FIG. 12B. Wire cutter 90 is comprised of two jaws 91, two cutting edges 92, pivots 93 and a spring 94. When a force is exerted against spring 94 by activating mechanism 25, spring 94 pushes outward against the tops of jaws 91 and causes said jaws to rotate about pivots 93, and creates a shearing action between cutting edges 92.

Figure 13:
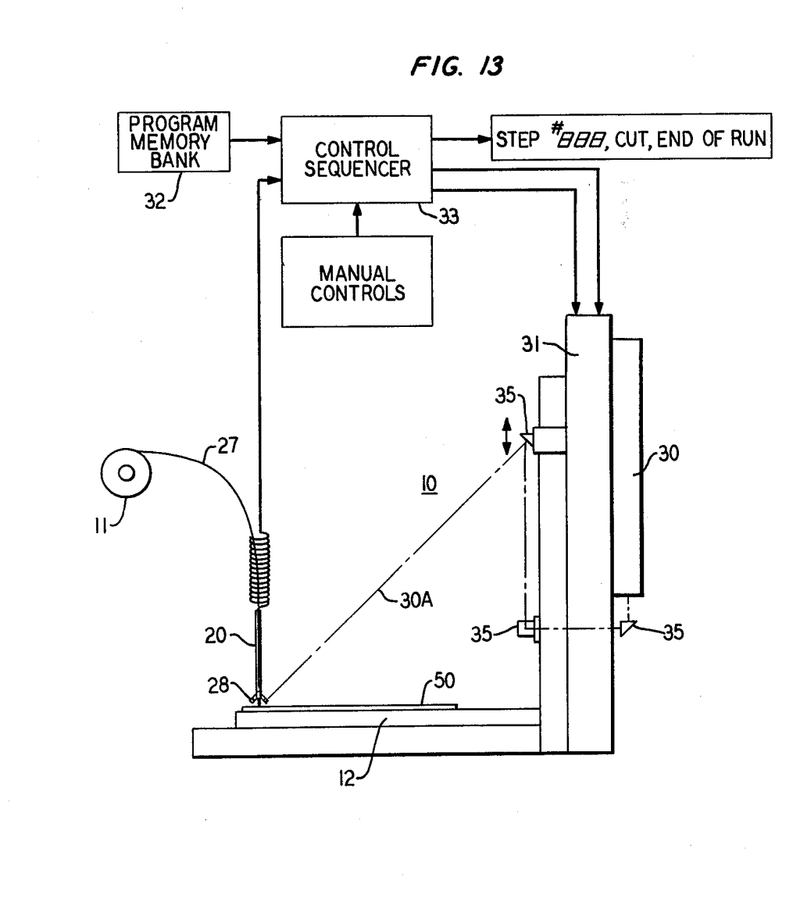
FIG. 13 is a schematic side view of a semiautomatic wiring machine.
Figure 14:
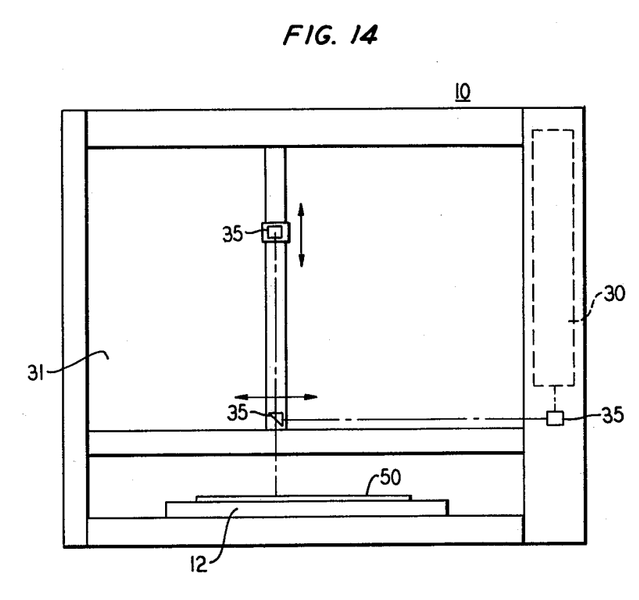
FIG. 14 is a schematic front view of a semiautomatic wiring machine.
Figure 15:
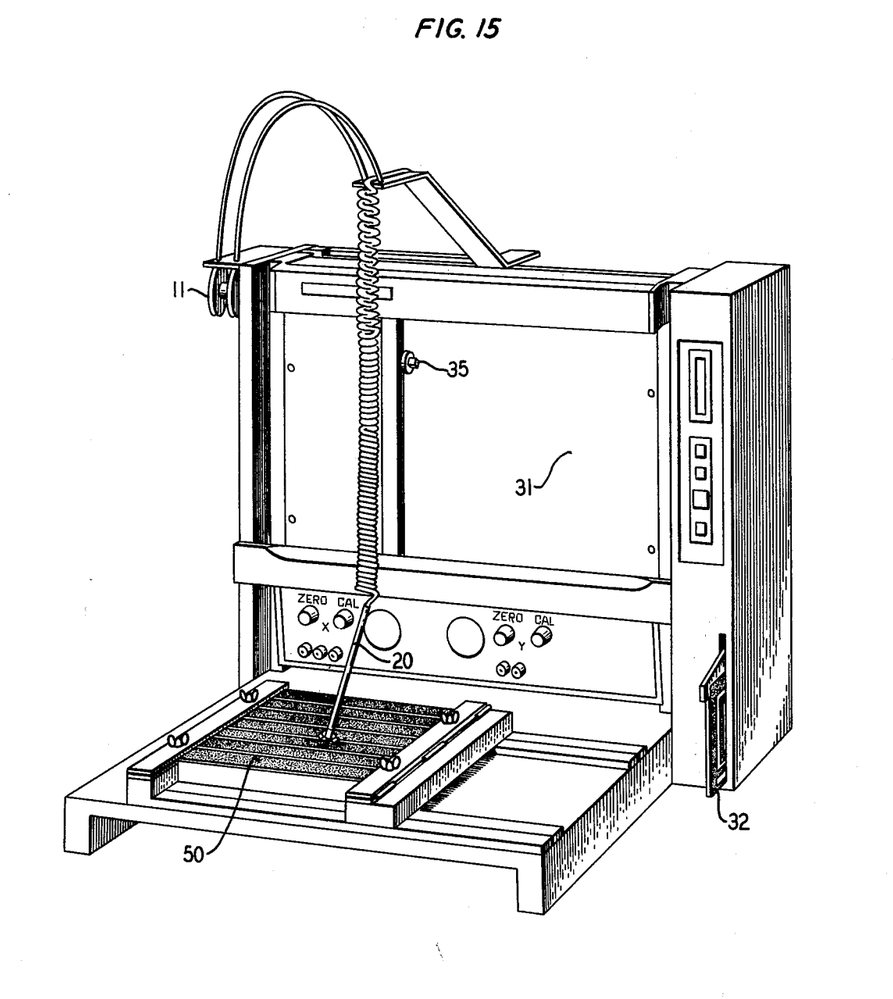
FIG. 15 is a perspective view of a semiautomatic wiring machine.

A semiautomatic wiring machine 10 shown in FIGS. 13, 14 and 15 makes an advantageous combination with the invention so far disclosed. Essentially this machine is comprised of a stationary mounting surface 12 for the printed circuit board 50, and XY recorder 31 or equivalent, a laser 30, the aforementioned tool 20 with phototransistors 28 mounted thereon, a source of insulated electrical conductor 11, a programmable read-only memory (PROM) bank 32, and conventional associated electronics (not shown).

The schematic or layout information of a circuit to be breadboarded is placed in the format of a computer program. The program generates a sequence of XY locations including end-of-run and job-complete information. This information is loaded into the programmable read-only memory (PROM) bank 32. Eight PROMs are used, four PROMs contain the X coordinates and four contain the Y coordinates. The eight PROMs provide a storage capability of 1,024 wiring points. This PROM bank 32 is plugged into the semiautomatic wiring machine 10. The XY coordinates control the XY recorder 31. The sequencer 33 output is used as the PROM address. The arrangement described in this paragraph is conventional.

The laser beam 30A is deflected by prisms 35 mounted on XY recorder 31 to illuminate with a spot of light the appropriate IPSBC terminal. The operator makes a connection to the spotlighted IPSBC terminal using tool 20. As tool 20 pushes conductor 27 into said IPSBC terminal, phototransistor 28 mounted on said tool 20 intercepts laser beam 30A and generates a pulse that steps the control sequencer 33 one count.

When a wire run is complete, the X and Y PROM outputs are all in the logic "one" state. This condition energizes an appropriate indicator, and steps the sequencer by one count, the laser beam 30A moves to the beginning of the next wire run. When the wiring is completed, the X PROM outputs are all in the logic "zero" state and the Y PROM outputs are all in the logic "one" state and an appropriate indicator is operated.

A fully automatic wiring machine that performs the functions mentioned above is evisioned within the scope of this invention wherein actuators serve to operate a modified tool similar to tool 20.

The breadboarding technique described is quite durable and dependable. However, since breadboarding may be an intermediate stage of development, a wired board may be subject to rough handling and extreme environmental conditions in a field trial. In these instances, the reliability of said wired board could be further enhanced by vacuum packaging the wired board similar to the vacuum packaging used on some products sold in department stores. The holes 53 in printed circuit 50 conveniently adapt to this process.

What is claimed is:

1. Apparatus for mounting electrical circuitry consisting of components having pin terminals, comprising:
   a board having first and second sides and a planar array of cylindrical holes therebetween for receiving said pin terminals inserted from said first side;
   and a wire and pin terminal receiving element said element characterized by:
      an elongate hollow metallic cylindrical body having a gap extending the full wall length, thereby rendering said body expandable;
      an outwardly-protruding rim disposed along the exterior surface of said body adjacent to a first end thereof;
      a metallic wire connector having a first end comprising a bifurcated slotted wire-receiving beam and a second end comprising a substantially flat edge, said connector second end being integrally attached to the second end of said body;
      the spacing between the flat edge of said connector and the protruding rim of said body equaling substantially the thickness of said board
      said body being compressably received in one of said holes in said board with said rim and said flat edge gripping said board between them thereby to rigidly but releasably mount said element on said board.

2. Apparatus pursuant to claim 1, further comprising a slotted washer defining beam gripping means for surrounding said slotted beam to limit the bifurcations from spreading apart under the force of contained wires.

3. Apparatus for mounting an electrical circuit comprising components having pin terminals said apparatus comprising:
   a board having a first and second sides;
   a multiplicity of paired cylindrical holes extending between said sides and arranged in plural parallel columns;
   plural discrete metal lands on said first and second board sides, each surrounding a respective said hole pair;
   said lands being electrically connected by metallization through said holes;
   and a wire and pin terminal receiving element comrising:
apparatus for mounting electrical circuitry consisting of components having pin terminals, comprising:
   a board having first and second sides and a planar array of cylindrical holes therebetween for receiving said pin terminals inserted from said first side;
   and a wire and pin terminal receiving element said element characterized by:
      an elongate hollow metallic cylindrical body having a gap extending the full wall length, thereby rendering said body expandable;
      an outwardly-protruding rim disposed along the exterior surface of said body adjacent to a first end thereof;
      a metallic wire connector having a first end comprising a bifurcated slotted wire-receiving beam and a second end comprising a substantially flat edge, said connector second end being integrally attached to the second end of said body;
      the spacing between the flat edge of said connector and the protruding rim of said body equaling substantially the thickness of said board
      said body being compressably received in one of said holes in said board with said rim and said flat edge gripping said board between them thereby to rigidly but releasably mount said element on said board.

4. Apparatus pursuant to claim 3 wherein said board further comprises:
   a first and a second metallization grid disposed on respective sides of said board, each grid surrounding said columns of holes and including:
   metal paths extending vertically from edge-to-edge between each column and
   plural horizontal paths linking adjacent vertical paths, each said horizontal path made up of a said metal land.

5. Apparatus pursuant to claim 3, wherein said selected metallized holes for mounting said connector means comprise vertical columns made up of either the right-hand or the left-hand members of all said paired holes;
   said pin terminals being received in the remaining metallized holes;
   said connector means being mounted into said board's first side; and
   said pin terminals being inserted from said board's second side.

* * * * *